United States Patent [19]

Maruyama et al.

[11] Patent Number: 5,349,930
[45] Date of Patent: Sep. 27, 1994

[54] HIGH TENSION CORD COVER WITH MISFIRE DETECTING CAPACITOR FOR INTERNAL COMBUSTION ENGINE

[75] Inventors: Shigeru Maruyama; Yuichi Shimasaki; Masaki Kanehiro; Takuji Ishioka; Shigeki Baba; Takashi Hisaki, all of Saitama, Japan

[73] Assignee: Honda Giken Kogyo Kabushiki Kaisha, Tokyo, Japan

[21] Appl. No.: 53,690

[22] Filed: Apr. 29, 1993

[30] Foreign Application Priority Data

May 1, 1992 [JP] Japan .................. 4-139809

[51] Int. Cl.$^5$ .......................... F02P 17/00
[52] U.S. Cl. .................. 123/143 C; 73/117.3
[58] Field of Search ...... 123/143 C, 169 PA, 169 EL, 123/169 PH; 73/117.2, 117.3; 324/378, 380, 399

[56] References Cited

U.S. PATENT DOCUMENTS

| | | | |
|---|---|---|---|
| 2,937,296 | 5/1960 | Logan | 324/399 |
| 4,052,665 | 10/1977 | Gruenwald | 324/399 |
| 4,706,639 | 11/1987 | Boyer et al. | 123/143 C |
| 4,751,430 | 6/1988 | Müller et al. | 123/169 R |
| 4,771,743 | 9/1988 | McDowell | 123/143 C |
| 4,825,167 | 4/1989 | Bayba | 324/399 |
| 4,987,771 | 1/1991 | Iwata | 73/117.3 |
| 5,046,464 | 9/1991 | Hisatomi et al. | 123/143 C |
| 5,168,842 | 12/1992 | Brooks | 123/143 C |
| 5,179,919 | 1/1993 | Foltz, Jr. et al. | 123/143 C |
| 5,194,813 | 3/1993 | Hannah et al. | 73/117.3 |

FOREIGN PATENT DOCUMENTS 52-118135 10/1977 Japan .
3-326509 11/1991 Japan .

Primary Examiner—E. Rollins Cross
Assistant Examiner—Thomas N. Moulis
Attorney, Agent, or Firm—Nikaido, Marmelstein, Murray & Oram

[57] ABSTRACT

A high tension cord cover disposed at an engine cylinder head for covering a groove in which high tension cords pass through for supplying an ignition voltage current to a spark plug of the engine. The cover is made of an insulation material and having a cord retaining section at the bottom surface facing the groove for retaining the cords in parallel with each other. A plate like conductor is embedded in the cover keeping a predetermined distance therefrom and sandwiching a portion of the insulation cover, whereby a capacitor, which constitutes a capacitive divider in cooperation with a second capacitor for detecting misfire through the ignition voltage, is formed between the conductive cores of the high tension cords and the plate like conductor. The conductor can be electrically shielded. A second member made of an insulation material can be provided in the groove underneath the cover for retaining the cords such that the conductor embedded in the cover is kept the predetermined distance from the cords.

27 Claims, 6 Drawing Sheets

HIGH TENSION CORD COVER WITH MISFIRE DETECTING CAPACITOR FOR INTERNAL COMBUSTION ENGINE

BACKGROUND OF THE INVENTION

1. Field of the Invention

This invention relates to a technology for detecting misfire occurring during operation of a gasoline or other spark-ignition internal combustion engine and more particularly to a high tension cord cover with a capacitor for detecting misfire for an internal combustion engine.

2. Description of the Prior Art

As is well known, in gasoline and other types of internal combustion engines a high voltage produced by an ignition coil is distributed to spark plugs at the engine cylinders by an ignition distributor or the like through a high tension cord (high voltage cable). At each cylinder, the resulting electric discharge between the spark plug electrodes produces a spark which ignites an air-fuel mixture that has been drawn into the cylinder and compressed at the proper time, causing the mixture to burn explosively. In the course of this ignition-combustion process in the internal combustion engine, the mixture may for some reason occasionally fail to burn properly. This is referred to as a misfire. Misfires can result from causes in either the fuel system or the ignition system. Misfires caused by problems in the fuel system are the result of an overly lean or overly rich air-fuel mixture. A spark is produced between the spark plug electrodes but the air-fuel mixture does not ignite. Misfires caused by problems in the ignition system are the result of spark plug electrode fouling or ignition circuit malfunctions which prevent normal spark discharge.

The occurrence of misfire in the course of engine operation not only degrades engine performance but may degrade fuel consumption, or may cause after-firing of unburned gases in the exhaust system which can affect the exhaust emission control system and have other adverse effects. Moreover, since the occurrence of even a single misfire indicates a misadjustment or malfunction in the fuel or ignition system, prompt elimination of the problem is essential. Because of this, there is a strong need for development of a detector for detecting misfires as soon as they occur.

One type of misfire detector that has been proposed is the mis-spark detector described in Japanese Laid-open Patent Publication No. 52(1977)-118135. As shown in FIG. 8, the detector includes a conductor 51 wrapped around a portion of a high tension cord (high-voltage cable) 50 of the engine ignition system so as to constitute a detection capacitor 52 (a type of capacitance probe) in which the insulation cladding 50A of the high tension cord 50 serves as the dielectric. A voltage divider capacitor 53 is connected between the capacitor 52 and ground so that the ignition voltage (secondary voltage of the ignition coil) applied to the conductive core 50B of the high tension cord 50 induces a voltage across the terminals of the capacitor 52 owing to its static capacitance. The induced voltage is statically divided by the capacitor 52 and the capacitor 53, and the voltage across the terminals of the capacitor 53 (the divided voltage) is forwarded as a detection voltage to an electronic circuit 54 for processing and discrimination. The electronic circuit 54 discriminates the occurrence of misfires from the difference between the wave form of the ignition voltage at the time of normal spark discharge and that at the time of no spark discharge (mis-sparking). Among the different types of misfires, the detector thus detects misfires that occur when no spark discharge is produced owing to a problem in the ignition system.

Another detector for detecting misfire in internal combustion engines is disclosed in the present assignee's Japanese Patent Application No. 3(1991)-326509. In this detector, the ignition voltage is similarly detected through the capacitive divider, and misfire owing to causes in the fuel system is detected based on the fact that, even when spark discharge occurs, the wave form of the ignition voltage differs between the case where normal combustion occurs and the case where it does not.

In the conventional misfire detectors, as the means for detecting ignition voltage there is thus used such a "capacitance probe" constituted by wrapping a sheet or ribbon of conductor around the high tension cord of the ignition system so as to form the detection capacitor between the conductor and the core of the high tension cord via the insulation cladding of the high tension cord as the dielectric. However, the capacitance probe constituted in this manner has a major drawback that derives from the nature of the high tension cord of the ignition system. Because of its flexibility and elasticity, the high tension cord is highly susceptible to vibration. It is also easily affected by changes in the ambient humidity, wetting by leaking water, and fouling with oil, grime and the like. When a capacitor for use in detection is formed by wrapping a conductor ribbon around the cord, the static capacitance of the capacitor is apt to be changed from the proper value by shifting of the conductor caused by vibration as well as by changes in humidity, wetting with water and fouling with oil, grime and the like. Although some change in static capacitance can be tolerated if the capacitor is to be used only for checking the ignition voltage, even slight changes have to be avoided when it is used for misfire discrimination because such discrimination generally requires accurate detection not only of the ignition voltage but also of the ignition voltage wave form. The capacitance changes to which the prior art capacitance probe is susceptible degrade the detected voltage wave form and make it impossible to discriminate misfire with high reliability.

In addition, the insulation cladding of the high tension cord is generally formed of synthetic rubber, the material is readily degraded when exposed to heat and fouling with oil and grime. This degradation of the insulation cladding after the detection capacitor has been formed by winding the conductor around the high tension cord not only produces a progress change in the static capacitance of the capacitor over time but also increases the risk of electric insulation breakdown. In the latter case, the high ignition voltage can leak to the conductor wrapped thereon. When this happens, the high leak voltage is apt to be conducted to the electronic circuitry of the misfire detection, whereby leading damage or causing to malfunction.

In actual practice, moreover, the flexibility and elasticity of the high tension cord make the work of attaching the conductor for forming the capacitor on the insulation cladding of the high tension cord and securing thereon difficult and troublesome. Maintenance of the so-formed capacitor is also troublesome.

Furthermore, the engine compartments of most modern cars are tightly packed with various devices, components and wiring. In providing the detection capacitor of a misfire detector, the conductor for detection constituting a part of the detection capacitor generally ends up being close to some other electrically conductive component. In this case, any change in the distance between the conductor for detection and the nearby conductive component will substantially change the capacitance of the detection capacitor. In addition, the detection capacitor will pick up noise from the nearby conductive component. Since any such change in capacitance or introduction of a noise component adversely affects the ignition voltage wave form detected by the detection capacitor, the detection accuracy is degraded.

SUMMARY OF THE INVENTION

This invention was accomplished in light of the foregoing circumstances and has as its basic object to provide a high tension cord cover with a misfire detecting capacitor for a spark-ignition internal combustion engine, which enables the static capacitance of the capacitance probe to be maintained constant, unaffected by mechanical vibration, humidity changes, water-wetting and the like, and also enables a high degree of freedom from the insulation degradation, thus ensuring accurate detection of even the voltage wave form, and which is also easy to install and maintain.

Another object of the invention is to provide a high tension cord cover with a misfire detecting capacitor for a spark-ignition internal combustion engine which prevents degradation of the accuracy of ignition voltage wave form detection owing to substantial change in the capacitance of the detection capacitor or to picked-up noise, even when the conductor for detection constituting a part of the detection capacitor is located in the vicinity of another electrically conductive member.

For realizing these objects, the present invention provides a high tension cord cover for covering at least one high tension cord having a conductive core therein carrying an ignition voltage current for an internal combustion engine, comprising a member made up of an insulation material for placing the at least one high tension cord, and a second conductor embedded in the member keeping a predetermined distance from the high tension cord and sandwiching a portion of the member such that a capacitor is formed

BRIEF DESCRIPTION OF THE DRAWINGS

These and other objects and advantages of the invention will be more apparent from the following description and drawings, in which.

DETAILED DESCRIPTION OF THE PREFERRED EMBODIMENTS

A high tension cord cover with a misfire detection capacitor according to the invention will be explained. In the embodiments, the cover is disposed on a cylinder head of an internal combustion engine. For ease of understanding, the high tension cord cover itself will firstly be explained.

Figure 7:
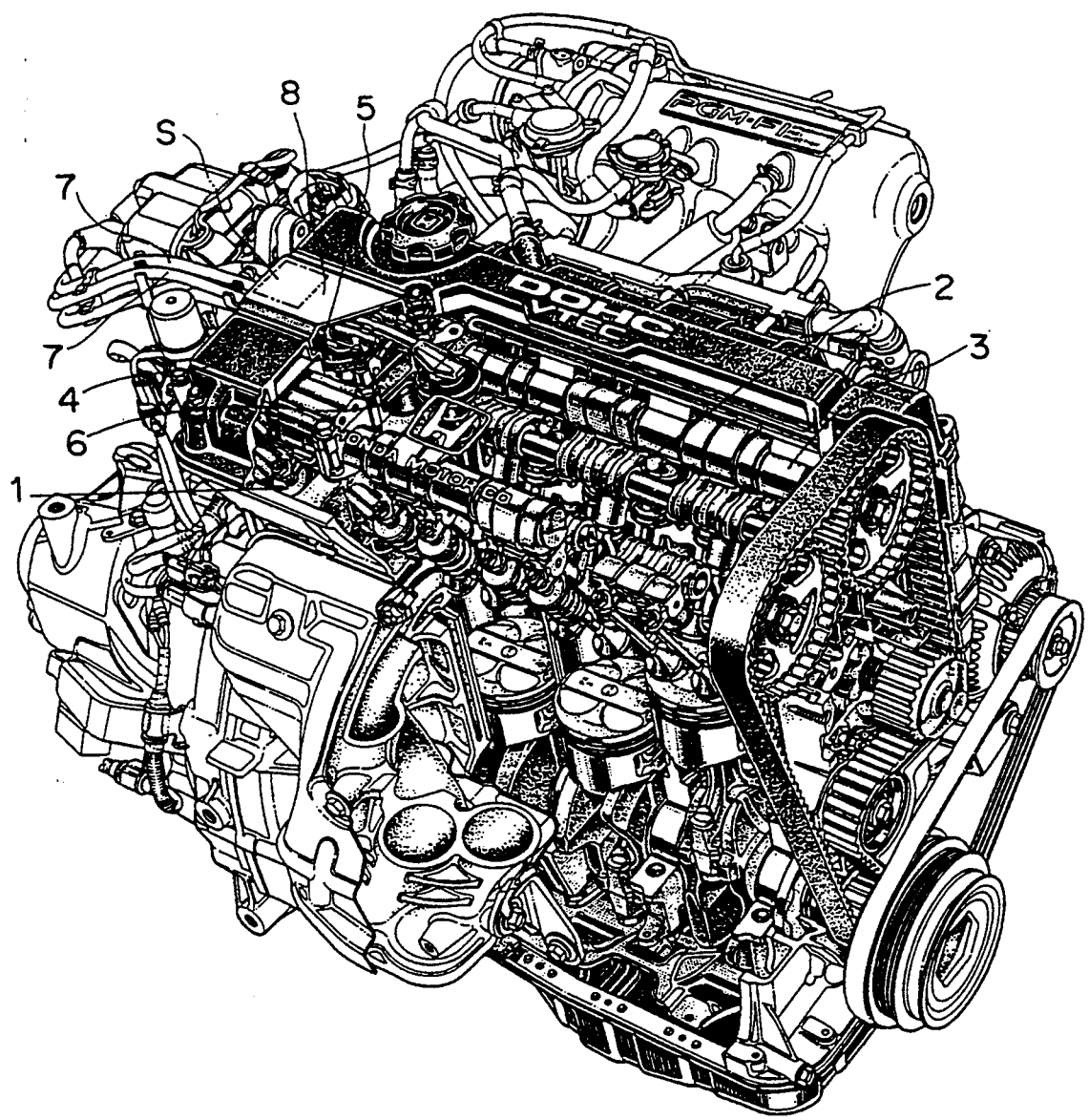
FIG. 7 is a perspective view of a high tension cord cover disposed on a cylinder head of a DOHC internal combustion engine.
Figure 8:
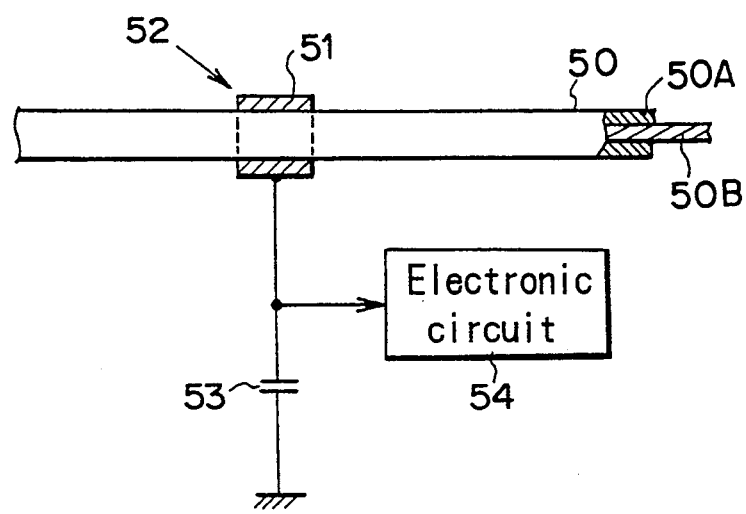
FIG. 8 is a schematic view showing the voltage detection means of a prior art misfire detector.

FIG. 7 shows this. In a cylinder head 1 of a DOHC engine, two camshafts 2,3 are overlaid by a cylinder head cover 4 on which a rectangular groove 5 is formed at a position immediately above the midway of the two camshafts 2,3. A plurality of high tension cords (high-voltage cables) 7 pass through the groove and supply high voltage currents to spark plugs 6 each provided for individual cylinders. The groove 5 is closed by a cover 8 for protecting the cords 7 from the damages.

In view of the above, a high tension cord cover according to a first embodiment of the invention will now be explained with reference to FIGS. 1 to 3. Here, components or elements in FIG. 7 which correspond to those in FIGS. 1 to 3 and on are assigned identical reference numerals to their counterparts in FIG. 7 and will not be explained further.

In the invention, the high tension cord cover 8 is made of insulation material such as synthetic resin. More specifically, the cover 8 has a body 10 which is made of an insulation material such as nylon resin. Like the aforesaid groove 5, the cover body 10 is rectangular in its plan view having the same width as that of the groove 5 and has a flat section 10A including its upper surface. And, the cover body 10 is bent at its both sides in the direction opposite to the upper surface to form a bent section 10B to be mated with the inner wall of the groove 5 if placed thereat. The cover body 10 is further formed with a cord retaining section 12 at the surface opposite to the flat surface. As illustrated most clearly in FIG. 2, the cord retaining section 12 is formed by providing recesses 13 at the surface, the number of which is identical to that of the cords 7. More specifically, each recess 13 is provided with a semicircular cross section and the depth of the recess is made slightly greater than the radius of the cords 7. The recesses are formed on the surface in parallel with each other and keeping a predetermined distance therebetween. A cut 15 is provided at a location between the adjacent recesses so as to prevent an edge 14 of each recess 13 from being elastically deformed. The cords 7 are placed in the recesses 13 one by one to be firmly secured there in position. The cover 8 is then placed at the groove 5 by mating the bent section 10B with the inner wall of the groove 5 as illustrated in the figures.

Here, a conductor 20 for detection is embedded in the flat section 10A of the cover body 10. The conductor 20 is made of a good conductive material such as copper or aluminum and is given a plate like shape having the width equal to or greater than the total width "W" (indicated in FIG. 2) of the recesses 13 (or cords 7 retained thereat). In addition, the plate like conductor 20 is placed in the cover body 10 when the cover body 10 is molded or fabricated such that its surface is in parallel with a plane connecting the center of conductive cores 7A of the cords 7 when they are placed in the recesses 13. That is; the conductor 20 is embedded in the body cover 10 such that distances between the conductor 20 and the individual conductive cores 7A of the cords 7 when rested at the recesses 13 are kept to be a predetermined value. The cover body 10 retaining the cords 7 and housing the conductor 20 is placed at the cylinder head cover 4 at a location "S" (shown by phantom lines in FIG. 7) adjacent to the end of the cylinder head cover 4.

Figure 1:
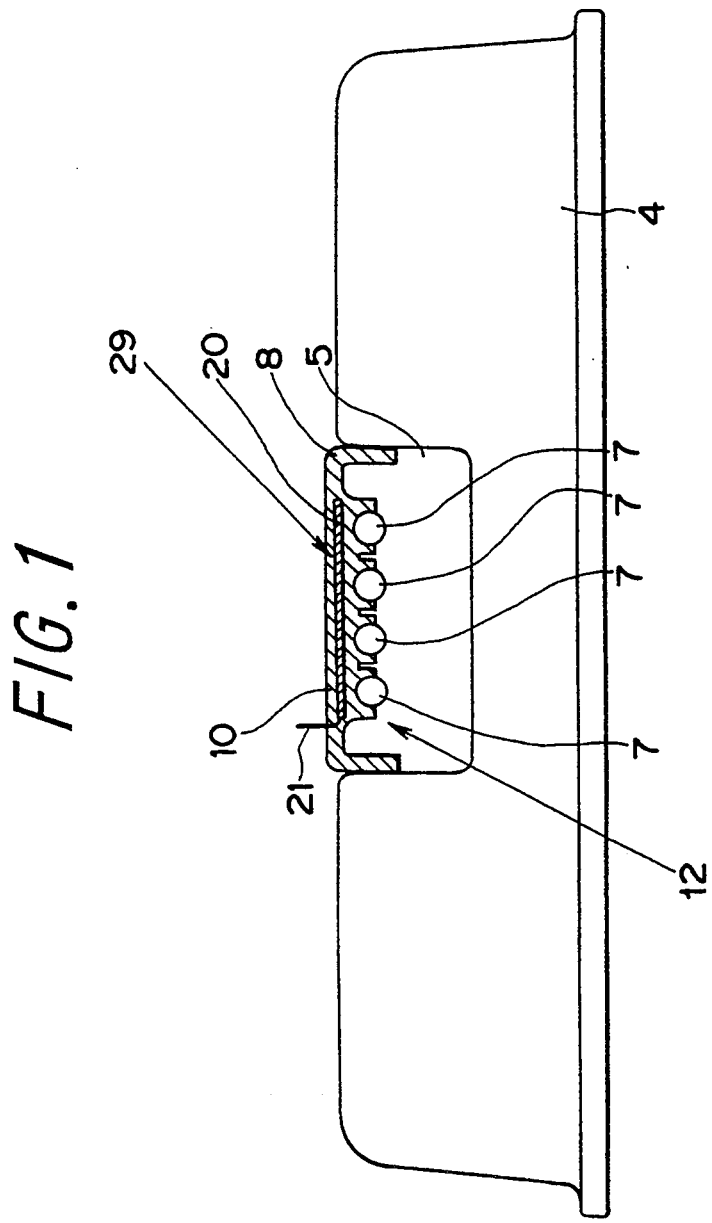
FIG. 1 is a sectional view of a high tension cord cover with a misfire detection capacitor for a spark-ignition internal combustion engine according to the invention disposed on a cylinder head of the engine.
Figure 2:
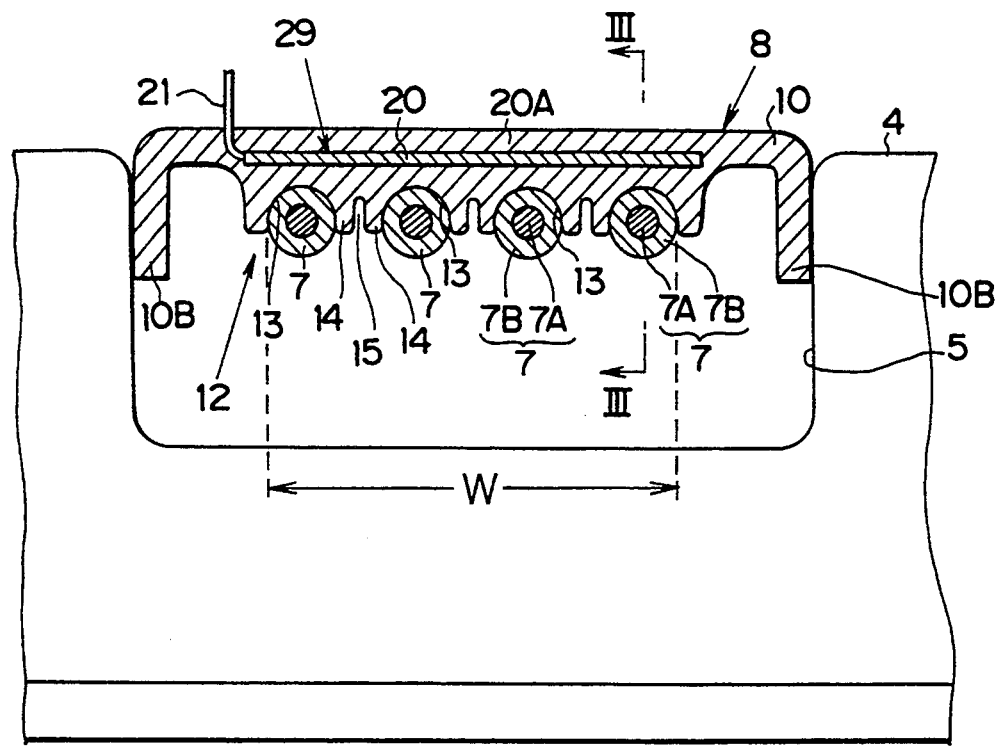
FIG. 2 is an enlarged sectional view of a portion of the high tension cord cover shown in FIG. 1.
Figure 3:
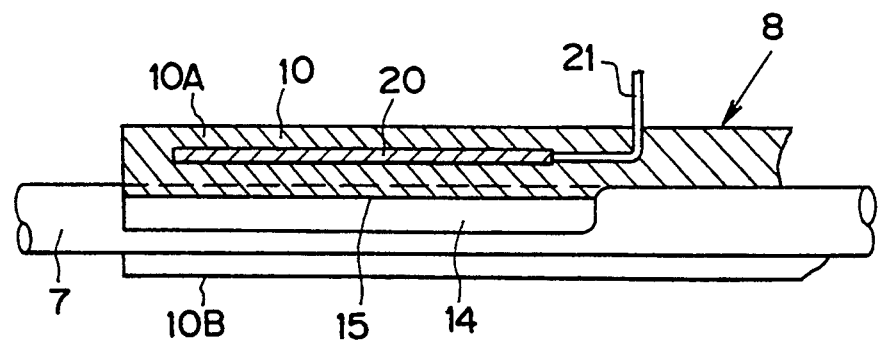
FIG. 3 is a sectional view taken along the line of III—III of FIG. 2.

As a result, in the configuration shown in FIGS. 1 to 3, the conductive cores 7A of the cords 7 and the conductor 20 facing them constitutes a detection capacitance 29 which has intervening claddings 7B and a part or portion of the cover body 10 as its dielectric. A lead 21 is connected with the conductor 20 for enabling voltage to be transmitted to the exterior of the cover body 10.

Figure 4:
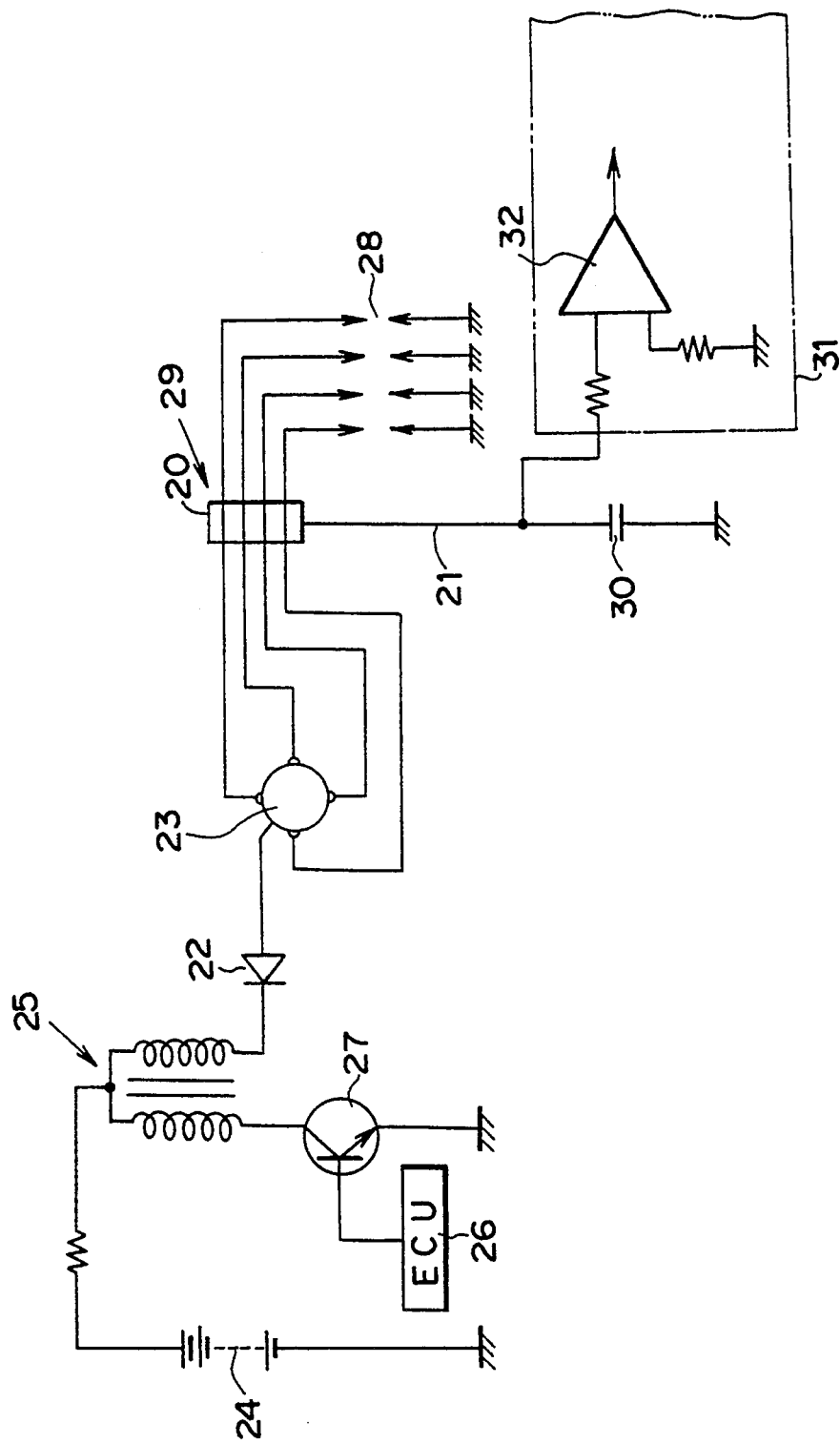
FIG. 4 is a wiring diagram showing the electrical circuitry of an ignition system utilizing the high tension cord cover according to the invention.

FIG. 4 is a schematic diagram showing the electric circuitry of an ignition system including the high tension cord cover of FIG. 1.

In FIG. 4, current flowing from a battery 24 through the primary winding of the ignition coil 25 is turned on and off by a power transistor 27 in response to ignition signals from an engine control unit (ECU) 26. The high-voltage current induced in the secondary winding of the ignition coil 25 passes through an ignition distributor 23 to spark plugs 28 of individual cylinders. A portion between the ignition distributor 23 and the spark plugs 28 corresponds to the high tension cords 7 illustrated in FIGS. 1 to 3 and the detection capacitor 29 is formed by providing the single conductor 20 for a group of the cords 7 at the cover body 10 as was explained. The detection capacitor 29 is connected in series with a voltage divider capacitor 30 by the lead 21. The other terminal of the voltage divider capacitor 30 is grounded and an intermediate point (the voltage division point) between the detection capacitor 29 and the voltage divider capacitor 30 is connected with one terminal of an amplifier 32 on the input side of a misfire detector 31.

Here, a high voltage is produced on the secondary winding of the ignition coil 25 every time an ignition signal from the engine control unit 26 causes the power transistor 27 to switch from the on state to the off state and thus cut off the supply of current to the primary winding of the ignition coil 25. The current produced by this high voltage passes through an diode 22 (located at an appropriate position in the ignition system) and to the ignition distributor 23 and then to the spark plugs 28 where it produces a spark discharge between the terminals of each spark plug 28. The voltage of the current flowing through the conductive cores 7A of the cords 7 at this time is capacitively divided by the capacitors 29, 30, and the capacitive-divided voltage is applied as a detection voltage to the misfire detector 31. The misfire detector 31 compares the wave form of the detection voltage with a reference wave form for discriminating the presence/absence of misfire.

Furthermore, as was explained earlier, when normal combustion does not occur and ions are therefore not produced at the gap between the electrodes of the spark plugs 28, then, during the latter half of the discharge period, a current tends to be produced in the opposite direction from the direction of the normal discharge current. However, since this reverse current (tending to flow from the spark plug 28 toward the ignition coil 25) is suppressed by the diode 22, there is no possibility of the ignition voltage being canceled out by the reverse current. Thus, since there is no possibility of the wave form of the ignition voltage being disturbed by any such reverse current, accurate discrimination of the presence/absence of misfire is ensured at all times.

And, since the high tension cord cover 8 is firmly secured to cylinder head cover 4, the conductor 20 itself is free from being vibrated. Moreover, the conductor 20 is integrally embedded in the cover body 10, any vibration it does receive will not shift the position of the conductor 20 or deform the same. In addition, since the conductor 20 is located in the cover body 10, the conductor 20 is isolated from changes in humidity and other ambient conditions and is also safe from the invasion of oil, grime and the like from the outside. Moreover, the part or portion of the cover body 10 is present as the insulator between the conductive cores 7A and the conductor 20, together with the claddings 7B of the cords 7. Thus, it is no longer needed to solely use the cord's cladding 7B such as made of synthetic rubber which has less service life than others.

Figure 5:
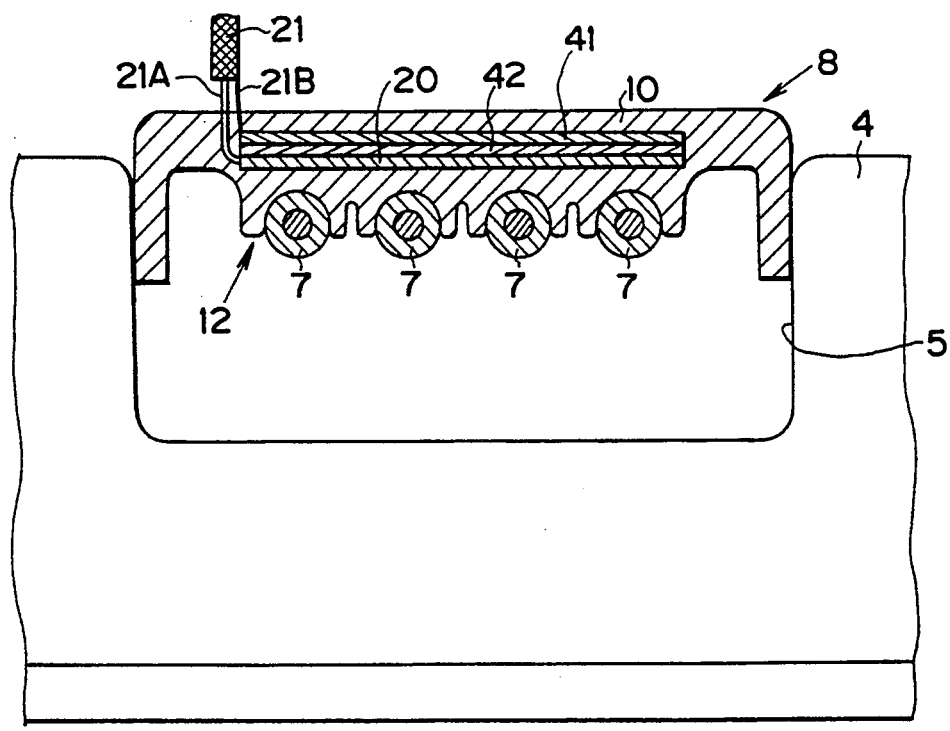
FIG. 5 is an enlarged sectional view, similar to FIG. 2, but showing a high tension cord cover according to a second embodiment of the invention.

FIG. 5 shows a high tension cord cover according to a second embodiment of the invention, in which a shield member 41 is provided near the conductor 20.

The shield member 41 of FIG. 5, having a plate like shape, is fabricated from screen, net, foil or thin sheet of a good conductor material such as copper or aluminum and is disposed to be in parallel with the outer surface of the conductor 20 at a fixed distance outward thereof. An insulation layer 42 is sandwiched between the conductor 20 and the shield member 41. The insulation layer 42 can be a resin material which also serves as a boding agent for bonding the shield member 41 to the outer surface of the conductor 20, or can be formed of the same material of the cover body 10. In addition, the shield member 41 may be embedded integrally in the cover body 10 at the time of molding or fabricating the same. In order for the shield member 41 to exhibit a shield effect it has to be electrically grounded. Where a shielded wire is used for the aforementioned lead 21, as is normally the case, the grounding of the shield member 41 can be easily accomplished by connecting conductive core 21A of the lead 21 to the conductor 20 and connecting electrically grounded outer shield member 21B of the lead 21 to the shield member 41. In the third embodiment, since the shield member 41 is provided to protect the conductor 20 for detection. Therefore, even in a case where another conductive member is located near the high tension cord cover 8, there is little risk of the capacitance of the capacitor 29 for detection being caused to vary owing to changes in the distance between the cover and the conductive member, or to pick up noise from the conductive member.

Figure 6:
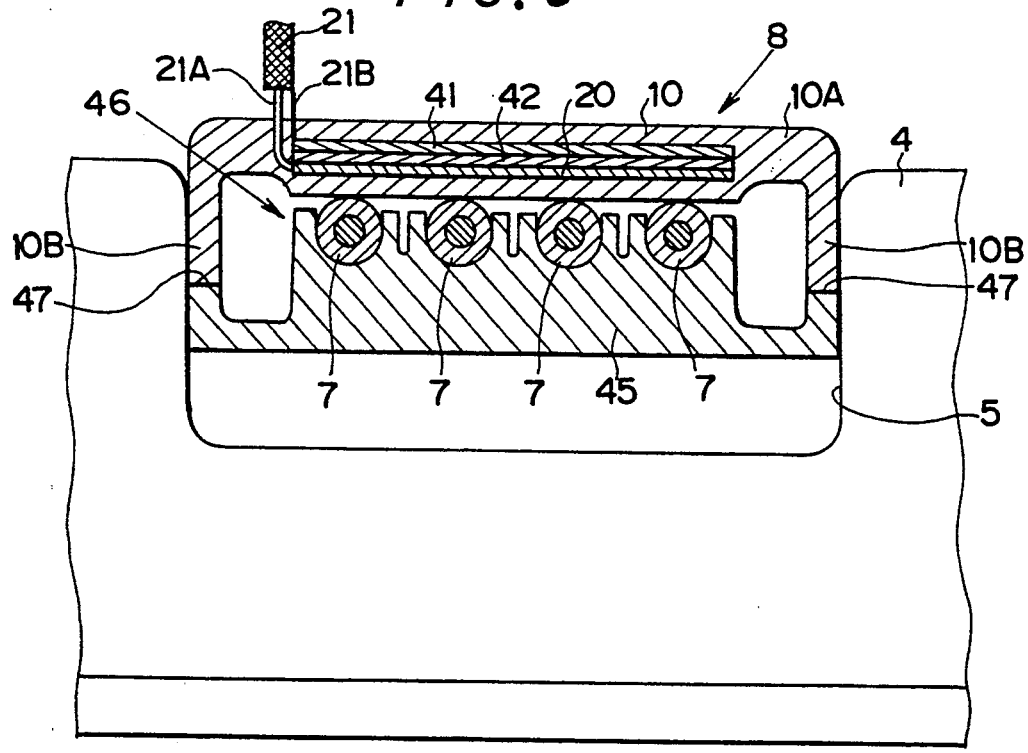
FIG. 6 is an enlarged sectional view, similar to FIG. 2, but showing a high tension cord cover according to a third embodiment of the invention.

FIG. 6 shows a high tension cord cover according to a third embodiment of the invention.

In the foregoing embodiments, the cover body 10 is provided with the cord retaining section 12 in which the positional relationship between the cover body 10 and the high tension cords 7 are maintained at a constant value. Moreover, it is advantageous in that the conductor 20 embedded in the cover body 10 can also function as a reinforcing member for the retaining section 12 against a thermal deformation caused by heat. However, the retaining section need not necessarily be formed at the cover body 10 itself. That is, if the high tension cords 7 can be placed at a position underneath the cover body 10, i.e., at the inner position in the groove 5, the positional relationship will also be satisfied when the cover 8 is placed at a fixed location thereto. The third embodiment aims this.

More specifically, as illustrated in FIG. 6, a cord retainer 45 is provided in the groove 5 for holding the high tension cords 7 in parallel with each other. The cord retainer 45 is made of an insulation material similar to the cover body 10 and is formed with a cord retaining section 46 which has a similar configuration to that illustrated in the foregoing embodiments. Both sides of the cord retainer 45 is sized to be mated with the inner wall of the groove 5 and figured to have ends 47 which will be brought into tight contact with ends of the aforesaid bent section 10B of the cover body 10 if placed in the groove such that the conductive cores 7A of the cords 7 are kept at a predetermined distance from the conductor 20 embedded in the body cover 10. The rests of the configuration are the same as those of the foregoing embodiments. Thus, in the third embodiment, after putting the cords 7 in the retaining section 46 of the cord retainer 45 and placed it in the groove 5, the cover body 10 will then be inserted in the groove 5 until the ends of the cover's bent section 10B are come to contact with the mated ends 47 of the cord retainer 45. The cover 8 will therefore be placed at a position keeping a predetermined distance from the cords 7. Here, the positional relationship therebetween should preferably be arranged such that the bottom surface of the cover 8 are brought into contact with the upper surface of the cords 7 as shown in the figure.

In these embodiments, although the high tension cover 8 are overlaid on a group of the high tension cords 7, it may alternatively possible to arrange such that the cord retaining section 12 or 46 retains only a single cord 7 so that the cover 8 will be overlaid on the single cord.

Further, the embodiments are explained taking the cover disposed on the cylinder head, it can alternatively possible to use any other member for retaining the high tension cord(s) at any location of the engine, with or without the groove for protection the cord(s).

The present invention has thus been shown and described with reference to the specific embodiments. However, it should be noted that the present invention is in no way limited to the details of the described arrangements, changes and modification may be made without departing from the scope of the appended claims.

What is claimed is:

1. A high tension cord cover for covering at least one high tension cord having a conductive core therein carrying an ignition voltage current for an internal combustion engine, comprising:
    a member made of an insulation material for holding the at least one high tension cord; and
    a second conductor embedded in the member keeping a predetermined distance from the high tension cord and sandwiching a portion of the member between said high tension cord and said second conductor such that a capacitor is formed.

2. A cover according to claim 1, wherein the member is a cover for covering a groove formed at a portion of the engine for receiving the at least one high tension cord and the cover is formed with a cord retaining section at a surface facing the groove.

3. A cover according to claim 2, wherein the portion comprises a cylinder head cover of the engine.

4. A cover according to claim 2, wherein the cord retaining section formed at the cover is a recess having a semicircular cross section and the high tension cord is placed in the recess.

5. A cover according to claim 2, wherein the second conductor is embedded at a location between the surface facing the groove and a second surface opposite thereto.

6. A cover according to claim 2, wherein the cord retaining section formed at the cover comprises recesses configured side by side and each having a semicircular cross section and a plurality of the high tension cords are placed in the individual recesses.

7. A cover according to claim 6, wherein the second conductor is embedded at a location between the surface formed with the recesses and a second surface opposite thereto.

8. A cover according to claim 7, wherein the second conductor are embedded at the location keeping the predetermined distance from each of the high tension cords.

9. A cover according to claim 8, wherein the second conductor has a plate like shape.

10. A cover according to claim 9, wherein the width of the second conductor is not less than the total width of the recesses.

11. A cover according to claim 6, wherein a cut is formed between the adjacent recesses.

12. A cover according to claim 1, wherein the second conductor is electrically shielded.

13. A cover according to claim 5, wherein a shield member is disposed between the second surface and the second conductor for electrically shielding the same.

14. A cover according to claim 13, wherein an insulator is interposed between the shield member and the second conductor.

15. A cover according to claim 7, wherein a shield member is disposed between the second surface and the second conductor for electrically shielding the same.

16. A cover according to claim 15, wherein an insulator is interposed between the shield member and the second conductor.

17. A high tension cord cover for covering at least one high tension cord having a conductive core therein carrying an ignition voltage current for an internal combustion engine, comprising:
    a first member made of an insulation material for holding the at least one high tension cord;
    a second member made of an insulation material and disposed at a fixed position with respect to the first member; and
    a second conductor embedded in the second member keeping a predetermined distance from the high tension cord and sandwiching a portion of the second member between said high tension cord and said second conductor such that a capacitor is formed.

18. A cover according to claim 17, wherein either of the first and second members comprises a cover for covering a groove formed at a portion of the engine for receiving the at least one high tension cord.

19. A cover according to claim 18, wherein the portion comprises a cylinder head of the engine.

20. A cover according to claim 17, wherein the second member comprises the cover for covering the groove and the first member is placed at the inner position in the groove.

21. A cover according to claim 20, wherein the first member is formed with a cord retaining section at a surface opposing the second member.

22. A cover according to claim 21, wherein the cord retaining section formed at the first member comprises recesses configured side by side and each having a semicircular cross section and a plurality of the high tension cords are placed in the individual recesses.

23. A cover according to claim 22, wherein the second conductor is embedded in the second member at a position keeping the predetermined distance from each of the high tension cords retained at the first member.

24. A cover according to claim 23, wherein the second conductor has a plate like shape.

25. A cover according to claim 24, wherein the width of the second conductor is not less than the total width of the recesses.

26. A cover according to claim 22, wherein a cut is formed between the adjacent recesses.

27. A cover according to claim 17, wherein the second conductor is electrically shielded.

* * * * *